United States Patent [19]
Donohue et al.

[11] Patent Number: 4,959,330
[45] Date of Patent: Sep. 25, 1990

[54] CRYSTALLIZABLE GLASS AND THICK FILM COMPOSITIONS THEREOF

[75] Inventors: Paul C. Donohue, Wilmington, Del.; Kenneth W. Hang, West Chester, Pa.; Michael J. Haun, Wilmington, Del.

[73] Assignee: E. I. du Pont de Nemours and Company, Wilmington, Del.

[21] Appl. No.: 438,833

[22] Filed: Nov. 17, 1989

Related U.S. Application Data

[63] Continuation-in-part of Ser. No. 368,843, Jun. 20, 1989, abandoned, which is a continuation-in-part of Ser. No. 277,118, Nov. 29, 1988, abandoned.

[51] Int. Cl.$^5$ .................... C03C 10/06; C03C 3/085
[52] U.S. Cl. .......................................... 501/8; 501/17; 501/20; 501/26; 501/69; 428/689; 428/702
[58] Field of Search .................. 501/8, 17, 26, 69; 428/689, 702

[56] References Cited

U.S. PATENT DOCUMENTS

| | | | |
|---|---|---|---|
| 3,754,881 | 8/1973 | Petticrew | 501/8 |
| 3,816,172 | 6/1974 | Hoffman | 117/212 |
| 4,323,652 | 4/1982 | Baudry et al. | 501/32 |
| 4,618,590 | 10/1986 | Baudry | 501/26 |

FOREIGN PATENT DOCUMENTS 0253343 1/1988 European Pat. Off.

Primary Examiner—William R. Dixon, Jr.
Assistant Examiner—Deborah Jones

[57] ABSTRACT

A dielectric glass composition consisting essentially on a molar basis of 15–27% ZNO, 8–16% BaO, 40–60% $SiO_2$, 3–14% $Al_2O_3$, 0–5% PbO and 0.5–5% of a metal oxide selected from $ZrO_2$, up to 2.5% $P_2O_5$ and mixtures thereof, the composition being crystallizable and non-reducing when fired at 850°–900° C.

3 Claims, No Drawings

CRYSTALLIZABLE GLASS AND THICK FILM COMPOSITIONS THEREOF

CROSS REFERENCE TO RELATED APPLICATION

This application is a continuation-in-part of co-pending U.S. patent application Ser. No. 07/368,843, filed Jun. 20, 1989, which is a continuation-in-part of U.S. patent application Ser. No. 07/277,118, filed Nov. 29, 1988 and both now abandoned.

FIELD OF THE INVENTION

The invention relates to a crystallizable glass for use as a dielectric layer, especially for multilayer interconnect applications.

BACKGROUND OF THE INVENTION

Multilayer interconnect (MLI) circuits are increasingly important in hybrid microcircuit electronics for the connection of silicon integrated circuits to the outside world. The MLI is composed of insulating dielectric layers separating metal conducting signal lines which are connected by vias through the layers. The silicon integrated circuit is generally mounted in a chip carrier on the top of the MLI circuit.

As the silicon circuits become larger and have higher speed, more demands are placed on the properties of the MLI. The layers should have a low dielectric constant and dissipation factor, high insulation resistance and breakdown voltage. They must be physically strong, moisture-resistant, pinhole- and blister-free and compatible with the electrode metallizations. The metallizations may be air-fired noble metals, silver or silver alloys, gold or they may be copper which requires nitrogen firing throughout manufacture. The metallization should be easily solderable and adhere well to the dielectric after thermal aging.

The property requirements are achieved by design of the glass composition and optionally addition of filler. The powdered ingredients are mixed with organic vehicle to form a paste or tape for laying down the layers. The layers and metallizations are fired either together or sequentially at a temperature sufficient to densify the glass and ceramic components.

SUMMARY OF THE INVENTION

In its primary aspect, the invention is directed to a dielectric glass composition consisting essentially on a molar basis of 15-27% ZnO, 8-30% alkaline earth metal oxides selected from 7-21% BaO, 0-20% CaO, 0-12% SrO and mixtures thereof, 40-60% $SiO_2$, 3-14% $Al_2O_3$, 0-5% PbO and 0.5-5% of a metal oxide selected from $ZrO_2$, up to 2.5% $P_2O_5$ and mixtures thereof, the composition being crystallizable and non-reducing when fired at 850°-900° C. In a secondary aspect, the invention is directed to thick film compositions comprising finely divided particles of the above-referred glass dispersed in a liquid organic medium.

Definitions

Thick Film Processing Conditions—As used herein, the captioned term refers to a firing cycle of approximately 30 to 60 min., of which 5-10 min. is at a peak temperature of 850°-900° C.

Remainder Glass—When the glass composition of the invention is heated under Thick Film Processing Conditions, at least one crystal phase is formed out of the parent glass. The thusly formed crystals are dispersed in a matrix of the parent glass which has been changed in composition by the formation of the crystals therefrom. This glass, which remains after crystal formation and which serves as a matrix for the formed ceramic crystals, is referred to herein as "remainder glass".

PRIOR ART

U.S. Pat. No. 3,787,219 Amin

The reference is directed to a printable dielectric composition consisting of 1-40% wt. $CaTiO_3$ and 99-60% wt. of lead-free crystallizable glass frit. Upon firing, one major crystalline phase is formed from the glass—celsian ($BaAl_2Si_2O_8$)—and two minor phases are formed—sphene ($CaTiSiO_5$) and zinc orthosilicate [$(ZnO)_2SiO_2$].

U.S. Pat. No. 3,649,353 Ulrich

The reference is directed to a dielectric thick film composition consisting of 10-90% wt. $BaTiO_3$ and a crystallizable lead-free $BaTiO_3$ glass frit. Upon firing at 700°-1300° C., two crystalline phases are formed. The frit composition by weight is 54.7% BaO, 24.0% $TiO_2$, 3.2% $BaF_2$, 7.9% $Al_2O_3$, 2.0% $GeO_2$ and 8.2% $SiO_2$.

U.S. Pat. No. 4,323,652, Baudry et al.

The patent is directed to dielectric glasses containing on a molar basis 30-50% $SiO_2$, 20-40% ZnO, 0-20% $B_2O_3$, 0-10% $Al_2O_3$, 5-40% CaO, SrO and BaO, and 0-10% CoO. The reference glass does not have to contain $Al_2O_3$.

U.S. Pat. No. 4,392,180 Nair

The Nair patent is directed to thick film dielectric compositions comprising substituted perovskite inorganic dopant and a low temperature devitrifiable frit. The frit is disclosed generally to include glasses which yield a single crystalline phase having the same composition as the parent glass or which yield multiple crystalline phases having different compositions than the parent glass.

EP Appln. No. 87110052.5 Nair

The patent application is directed to crystallizing glasses having the following compositions by weight:

| | | |
|---|---|---|
| $SiO_2$ | 30% | 30% |
| $TiO_2$ | 8 | 8 |
| $Al_2O_3$ | 10 | 10 |
| BaO | 26 | 10 |
| ZnO | 10 | 10 |
| CaO | 6 | 24 |
| $B_2O_3$ | 8 | 8 |
| MgO | 2 | — |

EP Appln. No. 87110060.8 Nair

The patent application is directed to a crystallizing glass having the following compositions by weight: 30% $SiO_2$, 8% $TiO_2$ or $ZrO_2$, 12% $Al_2O_3$, 12% BaO, 24% ZnO, 6% CaO and 8% $B_2O_3$.

Swiss No. 1180361 Nemkovich

The patent discloses an essentially non-crystallizing dielectric glass prepared on a weight basis from 2-6% $SiO_2$, 31-75% $B_2O_3$, 18-20% $Al_2O_3$, 30-32% BaO, 4-6% CaO, 3-5% MgO and 1-7% ZnO.

Swiss No. 1127856 Bobkova et al.

The patent discloses low dielectric glass prepared on a weight basis from 21-23.5% $SiO_2$, 20-25% $B_2O_3$, 18-22% BaO, 8-10% $Al_2O_3$, 20-25% ZnO and $TeO_2$.

DETAILED DESCRIPTION OF THE INVENTION

Glass Frit

The glasses suitable for use in the invention are amorphous aluminosilicates which, upon being subjected to thick film processing conditions as defined above, form a primary crystalline ceramic phase of $BaAl_2Si_2O_8$ (celsian or hexacelsian). When these glasses are fired at higher temperatures such as 900° C., a secondary crystalline ceramic phase of hardystonite ($Ca_2\ Zn\ Si_2\ O_7$) may also be formed if calcium is present.

It has been found that glass compositions particularly suited to formation of dielectric layers are free of boron, alkali and reducible low melting oxides of lead, cadmium or bismuth. Boron oxide tends to entrap water and hydrocarbons which on firing are released forming bubbles. Alkali ions in the glass can diffuse and compromise the insulation of the layer resulting in low IR, BDV and shorts. Reducible, low melting oxides can produce blistering due to excessive glass flow and loss of oxygen on firing. However, these elements also tend to produce good glass flow which is required for dense film formation at the commonly used firing temperature of 850° C.

It was found that to get sufficient glass flow, the combination of Ba and Zn modifying elements in silicate glasses are most effective. The glasses of the invention contain in mole % 15–27% ZnO and 8–30% alkaline earth metal oxides consisting of 7–21% BaO, 0.5–20% CaO and 0–12% SrO. This combination of ZnO and alkaline earth metal oxides is also most effective in promoting vehicle burnout, especially in nitrogen firing in Cu/MLI fabrication.

Silica functions in the glass as a network former and can range from 40–60 mole %. Above 60%, the glasses are too high melting for sufficient flow at film forming temperatures. Below 40%, there is likely to be insufficient $SiO_2$ for complete glass formation and the glass excessively crystallizes, thus reducing hermeticity of the films. Poor hermeticity is indicated by high leakage current. At least 45% silica is preferred.

Alumina is also required to assist glass formation and to promote crystallization. These glasses in the system: $BaO/ZnO/SiO_2/Al_2O_3$ tend to crystallize on refiring during film manufacture between 850° and 900° C. Crystallization is desirable since it tends to limit glass flow on refire of the layers and decrease blister formation. The crystallizing phase is primarily celsian, $BaAl_2Si_2O_8$.

Because of its excellent glass-forming properties up to 5% of the CaO and SrO can be replaced by PbO or up to 5% PbO can be used in addition to the above described amounts of alkaline earth metal oxides.

Since the $Al_2O_3$ concentration in the glass is limited by solubility, it is also the limiting factor in celsian formation. At high $Al_2O_3$ content, about 12 mole %, the glasses flow less, crystallize more and are blister-free. This is most useful in Cu/MLI manufacture at 900° C. in $N_2$. At lower $Al_2O_3$ content, 5–6%, the glasses flow more, crystallize less, and are more suitable for 850° C. air fired layers. They are not as good in $N_2$ firing due to increased blister formation. Also, $Al_2O_3$ contents below 5% will produce excessive blisters.

It was found that the layers could be further improved by incorporation of $P_2O_5$ and/or $ZrO_2$ in the glass, $P_2O_5$ tends to improve glass flow and increase bonding to the metallization, especially Cu. The $ZrO_2$ also improves glass flow and improves the electrical properties of the layers. The presence of $ZrO_2$ is most useful in air fired layers to lower the DF, improve IR and decrease blistering. It is most effective in the absence of $P_2O_5$. Because of the limited solubility of $P_2O_5$ and $ZrO_2$ in this glass system, the useful range is up to about 5 mole % of each. It is preferred to use no more than 2.5 mole % $P_2O_5$.

To adjust further the film density, to minimize blistering, and to adjust expansion to match the substrate, filler phases may be incorporated in paste formulation. The most effective are silica or quartz to adjust thermal expansion and alumina to control porosity. Filler may be added up to the point where the glass flow is no longer sufficient to produce a hermetic film, about 15 wt. % of total solids.

The glasses are prepared by conventional glass-making techniques, i.e., by mixing the desired components in the desired proportions and heating the mixture to form a melt. As is well known in the art, heating is conducted to a peak temperature and for a time such that the melt becomes entirely liquid and homogeneous. In preparing the compositions of the invention, the components are premixed by shaking in a polyethylene jar with plastic balls and then melted in a platinum or ceramic container at about 1550° C. The melt is heated at the peak temperature for a period of at least one hour. Heating for less than one hour would result in inhomogeniety in the glass. A heating time of 1.5–2 hours is preferred. The melt is then poured into cold water. The maximum temperature of the water during quenching is kept below 120° F. by increasing the volumetric ratio of water to melt. The crude frit after separation from water is freed to residual water by drying in air or by displacing the water with methanol. The crude frit in slurry form is then ball milled in alumina containers using alumina balls. Alumina picked up by the materials, if any, is not within observable limits as measured by x-ray diffractional analysis.

After discharging the milled frit slurry from the mill, excess solvent is removed by decantation and the frit powder is air dried at 130° C. The dried powder is then screened through a 325 standard mesh screen to remove any large particles.

When the glasses of the invention are heated under thick film processing conditions, a primary phase of celsian or hexacelsian (as determined by x-ray diffraction) is formed out of the parent glass, crystals of which are dispersed in a matrix of the remainder glass, i.e., the glass which remains after crystallization. The remainder glass is always of different composition than the crystallized phase.

Organic Medium

Organic medium suitable for use in the invention are selected according to the physical form in which the encapsulant compositions are applied. In particular, the encapsulant glass frit can be applied as a thick film paste by screen printing and it can also be applied as a green tape.

When the encapsulant is applied by screen printing, the particles thereof are mixed with an inert liquid medium (vehicle) by mechanical mixing (e.g., on a roll mill) to form a pastelike composition having suitable consistency and rheology for screen printing. The latter is printed as a "thick film" in the conventional manner.

The main purpose of the organic medium is to serve as a vehicle for dispersion of the finely divided solids of the composition in such form that it can readily be applied to ceramic or other substrates. Thus the organic medium must first of all be one in which the solids are dispersible with an adequate degree of stability. Secondly, the rheological properties of the organic medium must be such that they lend good application properties to the dispersion.

Most thick film compositions are applied to a substrate by means of screen printing. Therefore, they must have appropriate viscosity so that they can be passed through the screen readily. In addition, they should be thixotropic in order that they set up rapidly after being screened, thereby giving good resolution. While the rheological properties are of primary importance, the organic medium is preferably formulated also to give appropriate wettability of the solids and the substrate, good drying rate, dried film strength sufficient to withstand rough handling, and good firing properties. Satisfactory apperance of the fired composition is also important.

In view of all these criteria, a wide variety of liquids can be used as organic medium. The organic medium for most thick film compositions is typically a solution of resin in a solvent frequently also containing thixotropic agents and wetting agents. The solvents usually boil within the range of 130°-350° C.

Suitable solvents include kerosene, mineral spirits, dibutylphthalate, butyl Carbitol TM, butyl Carbitol TM acetate, hexylene glycol and high boiling alcohols and alcohol esters. Various combinations of these and other solvents are formulated to obtain the desired viscosity and volatility.

By far the most frequently used and a frequently preferred resin for this purpose is ethyl cellulose. However, resins such as ethylhydroxyethyl cellulose, wood rosin, mixtures of ethyl cellulose and phenolic resins, polymethacrylates of lower alcohols and monobutyl ether of ethylene glycol monoacetate can also be used.

A preferred vehicle for thick film applications is based on ethyl cellulose and β-terpineol in a weight ratio of about 1:8. The pastes are conveniently prepared on a three-roll mill. A preferred viscosity for these compositions is approximately 100-200 Pa.s. measured on a Brookfield HBT viscometer using a #5 spindle at 10 rpm. The amount of vehicle utilized is determined by the final desired formulation viscosity.

Among the thixotropic agents which are commonly used are hydrogenated castor oil and derivatives thereof and ethyl cellulose. It is, of course, not always necessary to incorporate a thixotropic agent since the solvent resin properties coupled with the shear thinning inherent in any suspension may alone be suitable in this regard. Suitable wetting agents include phosphate esters and soya lecithin.

The ratio of organic medium to solids in the paste dispersions can vary considerably and depends upon the manner in which the dispersion is to be applied and the kind of organic medium used. Normally, to acheive good coverage, the dispersions will contain complementally by weight 40-90% solids and 60-10% organic medium.

The pastes are conveniently prepared on medium (vehicle) utilized is determined mainly by the final desired formulation viscosity and print thickness.

The compositions of the invention can also be easily used for the manufacture of green tape by the conventional method of slip casting a slurry of the glass particles dispersed in a solution of binder polymer, plasticizer and volatile solvent onto a flexible carrier such as polypropylene or Mylar ® polyester film or stainless steel, adjusting the thickness of the cast film by passing the cast slurry under a doctor blade and then heating the doctored slurry to remove the volatile solvent from the layer by evaporation. The solid layer of solids dispersed in a matrix of polymeric binder is removed from the carrier and slit to appropriate widths for use in making multilayer structures. Green tapes of this kind generally have a thickness of 3 to 15 mils.

A wide variety of polymeric materials can be used as the binder for green tape such as poly (vinyl butyral), poly (vinyl acetate), poly (vinyl alcohol), cellulosic polymers such as methyl cellulose, ethyl cellulose, hydroxyethyl cellulose, methylhydroxyethyl cellulose, atactic polypropylene, polyethylene, silicon polymers such as poly (methyl siloxane), poly (methylphenyl siloxane), polystyrene, butadiene/styrene copolymer, polystyrene, poly (vinyl pyrrolidone), polyamides, high molecular weight polyethers, copolymers of ethylene oxide and propylene oxide, polyacrylamides, and various acrylic polymers such as sodium polyacrylate, poly (lower alkyl acrylates), poly (lower alkyl methacrylates) and various copolymers and multipolymers of lower alkyl acrylates and methacrylates. Copolymers of ethyl methacrylate and methyl acrylate and terpolymers of ethyl acrylate, methyl methacrylate and methacrylic acid.

A preferred class of polymeric binders for making green tapes for the composition of the inventionare those disclosed by Usala in U.S. Pat. No. 4,613,648. These polymeric binders are a mixture of compatible multipolymers of 0-100% wt. $C_{1-8}$ alkyl methacrylate, 100-0% wt. $C_{1-8}$ alkyl acrylate, and 0-5% wt. ethylenically unsaturated carboxylic acid or amine, the multipolymer being further characterized as having a number average molecular weight ($M_n$) of 50,000 to 100,000, a weight average molecular weight ($M_w$) of 150,000 to 350,000, the ratio of $M_w$ to $M_n$ being no greater than 5.5, the total amount of unsaturated carboxylic acid or amine in the multipolymer mixture is 0.2-2.0% wt., and the glass transition temperature of the polymer and plasticizer therein, if any, is $-30°$ to $+45°$ C.

The organic medium in which the ceramic solids are dispersed contains principally the polymeric binder dissolved in organic solvent. However, the medium may contain other dissolved materials such as plasticizers, release agents, dispersing agents, thixotropic agents, stripping agents, antifouling agents and wetting agents.

It will be recognized that by adjusting the rheological properties of the dispersions of the invention and by changing the solvent component of the organic medium, the invention compositions can be applied to substrates by other methods than casting, e.g., by screen printing. When the compositions are applied by screen printing, the conventional organic media materials used for thick film materials can be used so long as the acrylic polymers are completely soluble therein at application temperatures.

For casting solutions, the solvent component of the organic medium is chosen so as to obtain complete solution therein of the polymer and sufficiently high volatility to enable the solvent to be evaporated from the dispersion by the application of relatively low levels of heat at atmospheric pressure. In addition, the solvent must boil well below the boiling point and decomposition temperature of any other additives contained in the organic medium. Thus, solvents having atmospheric boiling points below 150° C. are used most frequently. Such solvents include benzene, acetone, xylene, methanol, ethanol, methylethyl ketone, 1,1,1-trichloroethane, tetrachloroethylene, amyl acetate, 2,2,4-triethylpentanediol-1,3-mono isobutyrate, toluene, methylene chloride, 2-propanol and Freon ® TF (trichlorotrifluoroethane).

Test Procedures

Capacitance - Capacitance is a measure of the capability of a material to store an electric charge. Expressed mathematically, C=KA divided by t, where A equals area overlap of the conductors, t is thickness of the dielectric layer and K is dielectric constant.

The units of capacitance are farads or fractions thereof such as microfarads, $10^{-9}$ farad, or picofarads $10^{-12}$ farad.

Dissipation Factor—Dissipation Factor (DF) is a measure of the phase difference between voltage and current. In a perfect capacitor, the phase difference would be 90°. However, in practical dielectric systems, DF is less than 90° because of leakage and relaxation losses. In particular, DF is the tangent of the angle by which the current lags the 90° vector.

Insulation Resistance—Insulation resistance (IR) is a measure of the ability of a charge capacitor to withstand leakage in DC current. Insulation resistance is a constant for any given dielectric regardless of capacitance.

The IR test under hot conditions is performed at room temperature. The test itself measures "RC Product" which is the product of IR times Capacitance. The IR is then calculated from the RC product by dividing into it the previously measured value of Capacitance. Under these conditions, the IR is determined periodically during the aging process. An IR value of $1 \times 10^9$ ohms is considered to be satisfactory and IR values of at least $1 \times 10^{12}$ ohms are preferred.

Breakdown Voltage—The Breakdown Voltage test (also called the dielectric strength test) consists of the application of a voltage higher than rated voltage for a specific time between mutually insulated portions of a component part or between insulated portions and ground. The voltage is raised until the system fails which is indicated by short circuiting. This is used to observe whether the component part can operate safely at its rated voltage and withstand momentary overpotentials due to switching, surges, and other similar phenomena. Although this test is often called a voltage breakdown or dielectric strength test, it is not intended that this test cause insulation breakdown or that it be used for detecting corona. Rather it serves to determine whether insulating materials and spacings in the component part are adequate. When a component part is faulty in these respects, application of the test voltage will result in either disruptive discharge or deterioration. Disruptive discharge is evidenced by flashover (surface discharge), sparkover (air discharge), or breakdown (puncture discharge). Deterioration due to excessive leakage currents may change electrical parameters or physical characteristics. Dielectric breakdown is reported in volts/mil or volts/cm of dielectric thickness. Dielectric layers are designed to have sufficient thickness to provide a margin of safety well below the breakdown of the electric. The test is conducted in accordance with MIL-STD-202E. 16 Apr. 1973.

Leakage Current—The Leakage Current test is a measure of the level of hermeticity of a fired dielectric film as measured by a D.C. voltage-driven electrolytic current when the dielectric is immersed in a saline solution.

Test specimens are prepared by printing a thick film conducting pattern on twelve $2'' \times 2''$ $Al_2O_3$ substrates. The conductor patterns are oven dried at 110°–120° C. and then fired at 850° C. Two layers of patterned dielectric materials are then applied sequentially on top of the fired conductor. Each of the layers is oven dried at 150° C. and fired at 850° C. Thickness of the combined dielectric layers is 30–50 μm.

These test prints are placed in a prewired connector and positioned in a 1.0N NaCl solution so that the test print is completely immersed. Using a platinum anode, 10 volts are applied between the conductor assembly and anode and the current for each of 10 test samples is measured after 5 mins. under voltage. A leakage current of 50 $\mu A/cm^2$ or less is considered satisfactory.

TMA and DTA

The densification and crystallization behavior of the glass powders was characterized using the Du Pont 9900 Thermal Analysis System with Model 943 Thermomechanical Analyzer (TMA) and 1600° C. Differential Thermal Analyzer (DTA) attached.

The TMA is used to measure the percent thickness shrinkage of a pressed pellet of glass powder during a heating profile. The TMA data provides a measure of the temperature range of densification, the amount of densification, and the onset of crystallization. The data listed in the Examples were collected at a heating rate of 10° C./minute to 850° C. with an isothermal hold at 850° C. for 30 minutes. In the TMA unit a weight is placed on the top sample probe to hold it in place. The amount of weight can be varied, and can effect the shrinkage behavior of the sample. The TMA data presented in the Examples were collected using either a one or five gram weight. The weight used is indicated in the data tables.

The DTA is used to measure the temperature difference between a sample and standard, producing a curve of the endothermic and exothermic reactions of the sample. As a glass powder is heated it undergoes an endothermic shift due to the densification of the powder. When crystallization of the glass occurs an exothermic peak is produced. The onset, peak, and completion temperatures of these events were collected for the glass compositions of this patent using a heating rate of 10° C./minute to 1100° C., and are listed in many of the Examples.

Temperature Coefficient of Expansion (TCE)

Thermal expansion measurements were conducted using an Antler Model 1121 Dilatometer. The equipment uses a vertically oriented fused silica push rod and sample holder assembly to monitor changes in sample dimension while the sample is heated continuously at 3.0 degrees C. per minute. Primary calibration of the instrument was done using a sapphire single crystal. Corrections were applied to sample data correcting for errors in the measurement of the standard. The calculated expansion coefficients which were derived from the measurements are based upon the slope of the line connecting the expansion at the deformation temperature of the sample or the expansion at the processing temperature of 850° C. with the room temperature expansion value. The lower temperature value was used in the case of early sample deformation otherwise the 850° C. value was used.

Correlations between substrate bowing tests of typical multilayer circuit boards have indicated that an optimal expansion coefficient match to the substrate would be provided if the dielectric material possesses an expansion coefficient of 78.5–79.5×10$^{-7}$/°C.

Formulation

The glass ceramic compositions of the invention will ordinarily be formulated into a paste which is capable of being printed in any desired circuit pattern. Such pastes are made by dispersing the anhydrous glass frit into an appropriate organic medium as described herein above.

EXAMPLES

EXAMPLES 1–5

These examples illustrate the compositional ranges of the glasses.

Glasses were prepared by melting the ingredients at 1550° C. in Pt crucibles. The ingredients ZnO, BaCO$_3$, SiO$_2$, Al$_2$O$_3$·3H$_2$O and NH$_4$H$_2$PO$_4$ were weighed in proportions to produce the desired glass formula. The melts were fritted by pouring into water and powdered by ball milling in water for 8–36 hours. The slurries were dried at 130° C. in air. Surface areas of the powders typically ranged from 2–3.5 m$^2$/g.

Pastes were prepared by roll milling or mulling with a vehicle of ethyl cellulose dissolved in Texanol ®$^{(1)}$ solvent. Enough vehicle to produce a screen printable paste was used; typically 25%. Pastes were screen printed over electrodes of either silver or copper, and fired in either air at 850° C. or in nitrogen at 900° C.

$^{(1)}$ Texanol TM is a trademark of Eastman Chemical Products, Inc., Kingsport, Tenn. for 2,2,4-timethylpentanediol-1,3-monoisobutyrate.

Two layers of total thickness 30–50 microns were prepared over electrodes on substrates suitable for leakage current measurements. The current (leakage current) in micro amps flowing through the layer submerged in a 1M solution of NaCl was measured. The microstructure and blistering tendency were also observed.

The following table shows the composition of the glasses prepared to define the suitable ranges of composition. All showed varying degrees of acceptability as dielectrics and suggest that increasing the ingredient concentrations further would result in poorer properties due to high sintering temperature or excessive crystallization leading to porosity. Compositions are given in mole %.

TABLE 1

Glass Composition - Definition of Compositional Limits

| Example No. | 1 | 2 | 3 | 4 | 5 |
|---|---|---|---|---|---|
| BaO | 12.5 | 6.3 | 20.5 | 12.0 | 11.4 |
| ZnO | 15.6 | 27.3 | 18.9 | 20.0 | 19.0 |
| Al$_2$O$_3$ | 12.5 | 6.3 | 5.6 | 6.0 | 15.2 |
| SiO$_2$ | 57.3 | 57.9 | 52.1 | 60.0 | 52.4 |
| P$_2$O$_5$ | 2.1 | 2.1 | 2.8 | 2.0 | 1.9 |

Glasses 1 and 2 illustrate low and high amounts of ZnO, respectively. Glasses 2 and 3 illustrate high and low amounts of BaO. Glasses 4 and 5 illustrate low and high amounts of Al$_2$O$_3$. Glasses 4 and 5 also illustrate high and low amounts of SiO$_2$.

EXAMPLES 6–9

Glasses were prepared according to the method described in Examples 1–5. Glasses 6–9 also contained ZrO$_2$. Except for the glass of Example 9, the powders were mixed with 7 wt. % quartz expansion modifying filler. Films were prepared over silver electrodes and dielectric properties tested. As shown by the data in Table 2 below, these properties are excellent for the construction of MLI circuits.

The examples show the effect of added ZrO$_2$. The DF and leakage current are lowered and IR is increased. These effects are further enhanced by removal of P$_2$O$_5$.

TABLE 2

Glass Dielectric Properties

| | Example No. | | | |
|---|---|---|---|---|
| | 6 | 7 | 8 | 9 |
| Composition | (Mole %) | | | |
| BaO | 12.6 | 12.3 | 12.5 | 12.5 |
| ZnO | 21.1 | 20.4 | 20.8 | 20.8 |
| Al$_2$O$_3$ | 6.3 | 6.1 | 6.2 | 6.2 |
| SiO$_2$ | 57.9 | 56.2 | 57.3 | 57.3 |
| P$_2$O$_5$ | 2.1 | 2.0 | — | — |
| ZrO$_2$ | — | 3.0 | 3.1 | 3.1 |
| Dielectric Properties | | | | |
| Capacitance, K | 6.5 | 6.9 | 7.9 | 8.9 |
| Dissipation Factor, % | 0.66 | 0.44 | 0.22 | 0.20 |
| Insulation Resistance (1 × 10$^{12}$ Ω/at 100 VDC) | 2.6 | 6.3 | 15.0 | 47.0 |
| Breakdown Voltage (KV/mil) | 1.5 | 1.5 | 2.1 | 1.9 |
| Leakage Current (μA/cm$^2$) | 3.7 | 0.2 | 0.2 | 0.2 |
| Film Thickness, μ | 48 | 45 | 25 | 35 |

EXAMPLE 10

Glass was prepared on a molar percentage basis from 11.88 BaO, 19.80 ZnO, 11.88 Al$_2$O$_3$, 54.45 SiO$_2$ and 1.98 P$_2$O$_5$. It was milled in water to 2.06 m$^2$/g and dried. To incorporate with CrO$_2$ burnout agent, 140 g was further milled with CrO$_2$ for 1 hour and dried. The CrO$_2$ was in the form of a very fine powder of 8 m$^2$/g surface area. 70 g of the dried powder mixture was milled with 30 g cellulosic vehicle (1.2 g ethyl cellulose in 28.8 g Texanol).

The paste was printed on substrates pre-electroded with Cu and fired at 900° C. in a nitrogen atmosphere belt furnace. The properties of the dielectric layer were:

| Dielectric Constant, K | 7 |
|---|---|
| DF, % | 0.85 |
| Insulation Resistance, (1 × 10$^{12}$ Ω at 100 VDC) | 3.9 |
| Leakage Current, μA/cm$^2$ | 28 |

To demonstrate its utility as an encapsulant, the above paste was printed over a dielectric layer of a more porous filled borosilicate material. The leakage current of this dielectric was 199.4 μA/cm$^2$. One and two layers of the paste were printed and fired over this porous dielectric and the leakage current was measured. The encapsulated leakage currents were 0.15 for one layer and 0.11 for two layers.

EXAMPLES 11–14

Two sets of two basic glasses were prepared by the method described hereinabove in which both members of each set of glasses contained identical molar quantities of BaO, ZnO, Al$_2$O$_3$ and SiO$_2$. One member of each set, however, contained five moles of B$_2$O$_3$. Each of these four glasses was then used to prepare a thick film paste by dispersing each of them in a cellulosic organic medium in a proportion of 76.6% wt. glass and 21.9% wt. organic medium. The pastes also contained 1.5% wt. of $Ba(NO_3)_2$ as a burnout agent. Each of the pastes was screen printed over an $Al_2O_3$ substrate having copper electrodes. The printed elements were then dried and fired for 10 minutes at a peak temperature at 900° C. in a nitrogen atmosphere. The fired elements were carefully observed with respect to bubble formation and it was found that the amount of bubble formation was related directly to the amount of $B_2O_3$ in the glass. The composition of the four glasses is given in Table 3 below.

TABLE 3

Study of Effect of $B_2O_3$ Content on
Bubble Formation - Glass Compositions

| Composition[1] | Example No. | | | |
|---|---|---|---|---|
| | 11 | 12 | 13 | 14 |
| | (Mole %) | | | |
| BaO | 12.2 | 11.6 | 15.5 | 14.8 |
| ZnO | 20.4 | 19.4 | 15.5 | 14.8 |
| $Al_2O_3$ | 11.2 | 10.7 | 10.7 | 10.2 |
| $SiO_2$ | 56.1 | 53.4 | 53.4 | 50.9 |
| $B_2O_3$ | — | 4.9 | 4.9 | 9.3 |

[1]Each glass contained 12 moles BaO, 20 moles ZnO, 11 moles $Al_2O_3$ 55 moles $SiO_2$.

EXAMPLES 15-17

A series of three base glasses was prepared as described above from identical molar amounts of BaO, ZnO, $Al_2O_3$, $SiO_2$ and $P_2O_5$. Two of the glasses, however, contained also 4 and 6 moles of $B_2O_3$. Each of the three glasses was used to prepare a thick film paste by dispersing each of them in a cellulosic organic medium. The paste also contained $CrO_2$ as a burnout agent. Each of the pastes was screen printed over an $Al_2O_3$ substrate having copper electrodes. The printed elements were then dried and fired for 10 minutes at a peak temperature of 900° C. in a nitrogen atmosphere and it was attempted to measure the leakage current of each element. The elements prepared from the boron-containing glasses (Examples 16 and 17) contained so many blisters that it was not possible to measure their leakage current by the above-described test. On the other hand, the element prepared from the $B_2O_3$-free glass (Example 15) had a measurable leakage current of 41 $\mu A/cm^2$.

TABLE 4

Effect of $B_2O_3$ Content Leakage Current

| Composition | Example No. | | |
|---|---|---|---|
| | 15 | 16 | 17 |
| | (Mole %) | | |
| BaO | 12.6 | 12.1 | 11.9 |
| ZnO | 21.1 | 20.1 | 19.8 |
| $Al_2O_3$ | 6.3 | 6.1 | 5.9 |
| $SiO_2$ | 57.9 | 55.6 | 54.6 |
| $P_2O_5$ | 2.1 | 2.0 | 2.0 |
| $B_2O_3$ | — | 4.0 | 5.9 |
| Leakage Current $\mu A/cm^2$ | 41 | (2) | (2) |

[1]Each glass contained 12 moles BaO, 20 moles ZnO, 6 moles $Al_2O_3$, 55 moles $SiO_2$ and 2 moles $P_2O_5$.
[2]Could not be measured.

EXAMPLES 18-22

A series of five glasses was prepared as described above from identical molar amounts of BaO, ZnO, $Al_2O_3$ and $ZrO_2$. However, the molar amount of $SiO_2$ varied from 41% to 55%. The glasses contained no fillers. Each of the glasses was used to prepare a thick film paste, the pastes were screen printed, dried and fired over an $Al_2O_3$ substrate having copper electrodes as in Examples 11-14. The electrical properties of the fired elements were measured. Composition of the glasses and the electrical properties of the elements made therefrom are given in Table 5 below. Glasses 18-21 had complete melt solubility; however, glass 22 contained small amounts of undissolved materials. The data for glasses 21 and 22 show that at least 45% $SiO_2$ is needed to obtain complete melt stability. However, electrical properties are degraded excessively if less than about 48% $SiO_2$ is used in the glass. It was also observed that when the glasses were fired at 850° C., the amount of crystallization became much higher, which resulted in higher porosity. Because the remainder glass of the low $SiO_2$ glasses combined both high ZnO and low $SiO_2$, the coatings were porous and therefore exhibited high leakage current, low insulation resistance and low breakdown voltage.

TABLE 5

Effect of $SiO_2$ Content on Glass Properties

| Composition[1] | Example No. | | | | |
|---|---|---|---|---|---|
| | 18 | 19 | 20 | 21 | 22 |
| | (Mole %) | | | | |
| BaO | 12.5 | 13.2 | 14.6 | 15.4 | 16.2 |
| ZnO | 20.8 | 22.0 | 24.4 | 25.7 | 27.0 |
| $Al_2O_3$ | 6.2 | 6.6 | 7.3 | 7.7 | 8.1 |
| $SiO_2$ | 57.3 | 55.0 | 50.0 | 47.4 | 44.7 |
| $ZrO_2$ | 3.1 | 3.3 | 3.6 | 3.8 | 4.0 |
| Dielectric Properties | | | | | |
| Capacitance, K | 8.9 | 8.0 | 8.1 | 8.1 | 8.7 |
| Dissipation Factor, % | 0.20 | 0.22 | 0.14 | 0.13 | 0.20 |
| Insulation Resistance ($1 \times 10^{12}$ Ω at 100 VDC) | 47.0 | 60.0 | 46.0 | 1.45 | <1 |
| Breakdown Voltage (KV/mil) | 1.9 | 2.4 | 1.7 | 1.1 | 0.5 |
| Leakage Current ($\mu A/cm^2$) | 0.2 | 2.2 | 19.0 | 99.2 | 1458 |

[1]All glasses contained 12 moles BaO, 20 moles ZnO, 6 moles $Al_2O_3$ and 3 moles $ZrO_2$.

EXAMPLES 23 and 24

Two additional glasses were prepared as described above containing the same molar amounts of BaO, ZnO, $Al_2O_3$ and $SiO_2$. However, one of the glasses contained 5.9 mole % $ZrO_2$ and the other only 5.0% $ZrO_2$ as compared with 3.1% $ZrO_2$ in the glass of Example 7. The $ZrO_2$ in the high $ZrO_2$ glass (Ex. 23) did not completely dissolve but it dissolved completely in the lower $ZrO_2$ glass (Ex. 24). Therefore, it is clear that the amount of $ZrO_2$ in the glass of the invention must be less than 6%. The glass of Example 24 was used to prepare a thick film paste which was screen printed, dried and fired over an $Al_2O_3$ substrate having copper electrodes as in Example 7. The electrical properties of the fired element were then compared with those of the element prepared from the glass of Example 7.

TABLE 6

Effect of $ZrO_2$ Content on Glass Properties

| Composition[1] | Example No. | | |
|---|---|---|---|
| | 23 | 24 | 7 |
| | (Mole %) | | |
| BaO | 11.9 | 12.0 | 12.2 |
| ZnO | 19.8 | 20.0 | 20.4 |
| $Al_2O_3$ | 5.9 | 6.0 | 6.1 |
| $SiO_2$ | 54.5 | 55.0 | 56.1 |
| $P_2O_5$ | 2.0 | 2.0 | 2.0 |
| $ZrO_2$ | 5.9 | 5.0 | 3.1 |
| Dielectric Properties | | | |

TABLE 6-continued

Effect of ZrO$_2$ Content on Glass Properties

| | Example No. | | |
|---|---|---|---|
| | 23 | 24 | 7 |
| Capacitance, K | 8.3 | — | 6.9 |
| Dissipation Factor, % | 0.46 | — | 0.44 |
| Insulation Resistance (1 × 10$^{12}$ Ω at 100 VDC) | 0.44 | — | 6.3 |
| Leakage Current ($\mu$A/cm$^2$) | 11.4 | — | 0.2 |

$^{(1)}$All glasses contained 12 moles BaO, 20 moles ZnO, 6 moles Al$_2$O$_3$, 55 moles SiO$_2$ and 2 moles P$_2$O$_5$.

The above data show that the dielectric properties of the element were somewhat better at the lower level of ZrO$_2$. Thus, the maximum amount of ZrO$_2$ in the glass composition of the invention should be no more than about 5%.

EXAMPLES 25 26 AND 27

Three glasses were prepared in the manner described above containing the same relatively high amounts of alkaline earth metal oxides (20.5 mole %). By comparison of the properties of these glasses with the glass of example 8 the effect of alkaline earth metal oxides in increasing TCE can clearly be seen. However, of particular interest is the fact that the substitution of CaO for part of the BaO quite unexpectedly lowered the leakage current from 12.5 to 0.005 $\mu$A/cm2. The composition and properties of the glasses are given in Table 7.

TABLE 7

Effect of Alkaline Earth Metal Oxide Addition on Glass Properties

| | Example No. | | | |
|---|---|---|---|---|
| | 8 | 25 | 26 | 27 |
| Composition | (Mole %) | | | |
| BaO | 12.5 | 20.5 | 15.9 | 12.4 |
| CaO | — | — | 4.6 | 0.8 |
| ZnO | 20.9 | 19.0 | 19.0 | 20.6 |
| Al$_2$O$_3$ | 6.2 | 5.6 | 5.6 | 6.2 |
| SiO$_2$ | 57.3 | 52.1 | 52.1 | 56.8 |
| ZrO$_2$ | 3.1 | 2.8 | 2.8 | 3.2 |
| Properties | | | | |
| TCE, ppm/°C. | 4.3 | 7.4 | 7.2 | — |
| Capacitance, K | 8.9 | 9.6 | 8.4 | 8.4 |
| Dissipation Factor, % | 0.20 | 0.13 | 0.10 | 0.1 |
| Insulation Resistance (1 × 10$^{12}$ Ω at 100 VDC) | 47 | 71 | 37 | 75 |
| Leakage Current ($\mu$A/cm$^2$) | 0.2 | 12.5 | 0.005 | 0.34 |

EXAMPLES 28, 29 AND 30

Three further glasses were prepared as described above similar to the glass of Example 26, but with SrO or PbO substituted for the CaO. The data in Table 8 below shows that the substitution of either SrO or PbO for CaO resulted in no significant adverse effect on the dielectrical properties of the glass.

TABLE 8

Substitution of SrO or PbO for CaO - Effect on Electric Properties

| | Example No. | | | |
|---|---|---|---|---|
| | 26 | 28 | 29 | 30 |
| Composition | (Mole %) | | | |
| BaO | 15.9 | 15.9 | 11.8 | 15.9 |
| CaO | 0.8 | — | — | — |
| ZnO | 19.0 | 19.0 | 21.3 | 19.0 |
| Al$_2$O$_3$ | 5.6 | 5.6 | 6.9 | 5.6 |
| SiO$_2$ | 52.1 | 52.1 | 47.5 | 52.1 |
| ZrO$_2$ | 2.8 | 2.8 | 2.4 | 2.8 |
| SrO | — | 4.6 | 10.1 | — |
| PbO | — | — | — | 4.6 |
| Properties | | | | |
| Capacitance, K | 8.4 | 8.3 | 8.9 | 8.3 |
| Dissipation Factor, % | 0.10 | 0.15 | 0.10 | 0.08 |
| Leakage Current ($\mu$A/cm$^2$) | 0.005 | 0.15 | 0.003 | 0.11 |

EXAMPLES 31-33

A series of compositions was prepared to show the effect of varying the amount of ZrO$_2$ in the glasses of the invention. The composition and properties of the glasses are shown in Table 9 below:

TABLE 9

Effect of ZrO$_2$ Variations

| | Example No. | | | |
|---|---|---|---|---|
| | 20 | 31 | 32 | 33 |
| Composition | (Mole %) | | | |
| BaO | 14.6 | 14.7 | 14.8 | 15.0 |
| ZnO | 24.4 | 24.5 | 24.7 | 25.1 |
| Al$_2$O$_3$ | 7.3 | 7.3 | 7.4 | 7.5 |
| SiO$_2$ | 50.0 | 50.1 | 50.6 | 51.4 |
| ZrO$_2$ | 3.6 | 3.4 | 2.4 | 1.1 |
| Glass Properties | | | | |
| DTA | | | | |
| Densification Temp (C.) | | | | |
| Onset | 820 | 814 | 807 | 810 |
| Completion | 872 | 864 | 850 | 857 |
| Crystallization Temp (C.) | | | | |
| Celsian/Hexacelsian | | | | |
| Onset | 874 | 864 | 850 | 857 |
| Peak | 905 | 895 | 871 | 886 |
| Dens. Comp-Dens. Onset | 52 | 50 | 43 | 47 |
| Cryst. Onset-Dens. Comp. | 2 | 0 | 0 | 0 |
| TMA (5 gm load) | | | | |
| Densification | | | | |
| Onset | 765 | 766 | 762 | 767 |
| Completion | 842 | 843 | 834 | 844 |
| Shrinkage (%) | 20.4 | 19.0 | 18.6 | 18.7 |
| Dens. Comp.-Onset | 77 | 77 | 72 | 77 |

The foregoing data show that a reduction in ZrO$_2$ made the glass less viscous, thus promoting crystallization. In the glasses of Examples 31-33 both densification and crystallization took place at a slightly lower temperature than the glass of Example 20. Furthermore, the temperature range of densification was reduced as the amount of ZrO$_2$ was lowered presumably because the onset of crystallization took place prior to complete densification of the glasses.

EXAMPLES 34-36

A further series of glasses was prepared to show the combined effects of varying the ZnO/BaO ratio with a reduction in Al$_2$O$_3$ and ZrO$_2$ in comparison with the glass of Example 20. The composition and properties of the glasses are shown in Table 10 below:

TABLE 10

Effect of BaO/ZnO Variations

| | Example No. | | | |
|---|---|---|---|---|
| | 20 | 34 | 35 | 36 |
| Composition | (Mole %) | | | |
| BaO | 14.6 | 18.1 | 19.3 | 20.8 |
| ZnO | 24.4 | 22.5 | 23.7 | 17.8 |
| $Al_2O_3$ | 7.3 | 6.9 | 5.7 | 7.6 |
| $SiO_2$ | 50.0 | 50.2 | 50.2 | 53.8 |
| $ZrO_2$ | 3.6 | 2.3 | 1.1 | — |
| ZnO/BaO Ratio | 1.67 | 1.24 | 1.23 | 0.85 |
| Total $Al_2O_3$ + $ZrO_2$ | 10.9 | 9.15 | 6.79 | 7.6 |
| Glass Properties | | | | |
| TCE (10−7/C.) | 69.5 | 74.5* | 84.2* | — |
| DTA | | | | |
| Densification Temp (C.) | | | | |
| Onset | 820 | 824 | 795 | 826 |
| Completion | 872 | 885 | 848 | 860 |
| Crystallization Temp (C.) | | | | |
| Celsian/Hexacelsian | | | | |
| Onset | 874 | 885 | 859 | 860 |
| Peak | 905 | 889 | 898 | 873 |
| $BaZn_2Si_2O_7$ | — | | | |
| Peak | — | 907 | 996 | 887 |
| Dens. Comp-Dens. Onset | 52 | 61 | 54 | 34 |
| Cryst. Onset. Dens. Comp. | 2 | 0 | 11 | 0 |
| TMA (5 gm load) | | | | |
| Densification | | | | |
| Onset | 765 | 767 | 747 | 780 |
| Completion | 842 | 847 | 834 | 850 |
| Shrinkage (%) | 20.4 | 22.6 | 23.2 | 16.4 |
| Dens. Comp.-Onset | 77 | 80 | 87 | 70 |
| Dielectric Properties | | | | |
| Dielectric Constant | 8.1 | 7.7 | 7.6 | 8.7 |
| Dissipation Factor (%) | 0.14 | 0.1 | 0.1 | 1.8 |
| Insulation Resistance (10 × 12) | 46 | 28 | 12 | 51 |
| Breakdaown Voltage (kV/mil) | 1.7 | 1.6 | 1.5 | 1.2 |
| Leakage Current ($\mu A/cm^2$) | 19 | 4.3 | 9 | 11 |

*Softening of the glass ocurred below 850° C., thus TCE listed was taken at the softening point.

The foregoing data show that the increase in BaO resulted in an increase in TCE over that of Example 20. Thus the glasses containing higher amounts of BaO would have a better thermal expansion match with alumina substrates at the firing temperature of 850° C. and would be less likely to incur bowing during firing.

The data also show the crystallization of a second phase ($BaZn_2Si_2O_7$) at higher temperatures. The decrease in ZnO without $ZrO_2$ in Example 36 caused a narrow densification range with crystallization occuring at a lower temperature. Furthermore, the TMA shrinkage of only 16.4% in Example 36 indicates that densification of the glass was incomplete during the firing at 850° C.

In Examples 34 and 35, it can be seen that the combined effects of reducing the $Al_2O_3$ and $ZrO_2$ and increasing the BaO brought about a broader densification range and a slight lowering of the crystallization temperature for the celsian phase. These examples both exhibited an increase in TMA shrinkage which indicates that they had better glass flow than the glass of Example 20. The leakage currents of the glasses of Examples 34 and 35 were lower than Example 20 due to their improved densification.

EXAMPLES 37 AND 38

The glass of Example 20 was modified with 20 and 40 weight % additions of $2CaO \bullet ZnO \bullet 2SiO_2$ (the formula of hardystonite). The compositions and properties of the two glasses are listed as Examples 37 and 38 in Table 11 with Example 20 also listed for comparison. By adding CaO, ZnO, and $SiO_2$ in the hardystonite ratio, the overall composition changed in an unobvious way which resulted in several significant improvements in properties.

The thermal expansion increased as the amount of $2CaO \bullet ZnO \bullet 2SiO_2$ was increased. A TCE of $78-80 \times 10^{-7}/°$ C. is ideal for a thick film dielectric on an alumina substrate, because the expansion is matched close enough to keep the bowing at an acceptable level, and with the TCE slightly lower than alumina the dielectric will be in compression, which strengthens the dielectric. In addition the effect of high expansion metal layers will be counteracted by the dielectric with an expansion lower than alumina. Thus, Example 37 with a TCE of $78.5 \times 10^{-7}/°$ C. is a preferred composition for an alumina expansion matched dielectric.

The DTA and TMA properties are listed in Table 11, showing the effect of the addition of $2CaO \bullet ZnO \bullet 2SiO_2$ on the densification and crystallization behavior. The addition of $2CaO \bullet ZnO \bullet 2SiO_2$ causes the densification rate to increase, which reduces the temperature range of densification. The difference in densification completion temperature and onset is listed in Table 11. The addition of 40 weight % $2CaO \bullet ZnO \bullet 2SiO_2$ to Example 20 reduces the densification temperature range from 48° to 20° C. This is because the overall composition is closer to that of a crystal.

Fast densification is very important for thick film dielectrics, expecially when crystallizable glasses are used, because the densification has to start at a high enough temperature to allow complete burnout of the organics, but complete before crystallization begins. If the crystallization starts before densification has completed, then the densification will not complete. This is what occurs with the composition of Example 20. The difference between the onset of crystallization and the completion of densification was approximated at 3° C. for this composition, but the TMA shrinkage of 14.9% indicates that the material has probably not completely densified (generally at least 16-17% is required). The leakage current of Example 20 confirms that it did not densify completely (see Table 11).

With the addition of 20 and 40 weight % $2CaO \bullet ZnO \bullet 2SiO_2$ the separation between densification and crystallization increased from 3° to 12° and 27° C. allowing complete densification to occur. The TMA % shrinkage also increased to above the level normally required to achieve complete densification, and the leakage current decreased by four orders of magnitude to very low levels.

TABLE 11

Effect of the Addition of $2CaO.ZnO.2SiO_2$

| | Example No. | | |
|---|---|---|---|
| | 20 | 37 | 38 |
| Composition | (Mole %) | | |
| BaO | 14.6 | 11.8 | 9.2 |
| CaO | 0.0 | 10.1 | 19.2 |
| ZnO | 24.4 | 21.3 | 18.5 |
| $Al_2O_3$ | 7.3 | 6.9 | 6.5 |
| $SiO_2$ | 50.0 | 47.5 | 45.2 |
| $ZrO_2$ | 3.6 | 2.4 | 1.3 |
| Glass Properties | | | |
| TCE ($10^{-7}/°$C.) | 68.5 | 748.5 | 84.2 |
| DTA | | | |
| Densification Temp (°C.) | | | |
| Onset | 808 | 811 | 823 |

TABLE 11-continued

Effect of the Addition of 2CaO.ZnO.2SiO$_2$

| | Example No. | | |
|---|---|---|---|
| | 20 | 37 | 38 |
| Completion Crystallization Temp (°C.) | 856 | 848 | 843 |
| Celsian/Hexacelsian | | | |
| Onset | 859 | 860 | 870 |
| Peak | 890 | 890 | 905 |
| Hardystonite Peak | — | 906 | 927 |
| Dens. Comp-Dens. Onset | 48 | 37 | 20 |
| Cryst. Onset. Dens. Comp. | 3 | 12 | 27 |
| TMA (1 gm weight) | | | |
| Densification | | | |
| Onset | 775 | 776 | 773 |
| Completion | 845 | 839 | 829 |
| Shrinkage (%) | 14.9 | 18.1 | 17.2 |
| Dens. Comp.-Onset | 70 | 63 | 56 |
| Dielectric Properties | | | |
| Dielectric Constant | 8.1 | 6.9 | 7.0 |
| Dissipation Factor (%) | 0.14 | 0.10 | 0.11 |
| Insulation Resistance ($10^{12}\Omega$) | 46 | 28 | 30 |
| Breakdown Voltage (KV/mil) | 1.7 | 2.6 | 1.5 |
| Leakage Current ($\mu A/cm^2$) | 19.0 | 0.001 | 0.003 |

EXAMPLES 39 AND 40

Two glasses were prepared having compositions intermediate to the compositions of the glasses of Examples 29 and 37. The glass of Example 39 was a 50/50 blend of Examples 29 and 37, while the glass of Example 40 was a 25/75 blend of those glasses. The composition and properties of the four glasses are given in Table 12 below:

TABLE 12

Compositions Between Examples 29 and 37

| | Example No. | | | |
|---|---|---|---|---|
| | 29 | 39 | 40 | 37 |
| Composition | (Mole %) | | | |
| BaO | 15.9 | 13.9 | 12.8 | 11.8 |
| CaO | 4.6 | 7.3 | 8.8 | 10.1 |
| ZnO | 19.0 | 20.1 | 20.7 | 21.3 |
| Al$_2$O$_3$ | 5.6 | 6.3 | 6.6 | 6.9 |
| SiO$_2$ | 52.1 | 49.8 | 48.6 | 47.5 |
| ZrO$_2$ | 2.8 | 2.6 | 2.5 | 2.4 |
| Glass Properties | | | | |
| TCE ($10^{-7}$°C.) | 77.0 | 80.5* | 87.4* | 78.5 |
| DTA | | | | |
| Densification Temp (°C.) | | | | |
| Onset | 819 | 816 | 813 | 811 |
| Completion | 874 | 856 | 854 | 848 |
| Crystallization Temp (°C.) | | | | |
| Celsian/Hexacelsian | | | | |
| Onset | 907 | 882 | 869 | 860 |
| Peak | 940 | 919 | 894 | 890 |
| Hardystonite Peak | 970 | 967 | 946 | 906 |
| Dens. Comp-Dens. Onset | 55 | 40 | 41 | 37 |
| Cryst. Onset. Dens. Comp. | 33 | 26 | 15 | 12 |
| TMA (1 gm weight) | | | | |
| Densification | | | | |
| Onset | — | 789 | 788 | 776 |
| Completion | — | 843 | 839 | 839 |
| Shrinkage (%) | — | 16.9 | 16.4 | 18.1 |
| Dens. Comp.-Onset | — | 54 | 51 | 63 |

*Softening occured before 850° C., thus the TCE listed was taken at the softening point.

The foregoing data show that as, the compositions change from Example 29 toward Example 37, the densification and crystallization temperatures decrease due to a combination of changes in chemistry. In particular, by decreasing SiO$_2$, ZrO$_2$ and BaO while simultaneously increasing ZnO, CaO and Al$_2$O$_3$, both the densification and crystallization temperatures decreased. Because of this lowering of crystallization temperature, when the glasses are fired at 850°–900° C. they will crystallize to a greater extent and therefore will have higher stability after repeated firings.

EXAMPLES 41–45

A further series of glasses in accordance with the invention were prepared in the manner of Example 37 to study the effects of adding still higher levels of ZrO$_2$ and to observe the effects of adding P$_2$O$_5$ to the composition of Example 37. The composition and properties of these glasses is given in Table 13 which follows:

TABLE 13

Effect of ZrO$_2$ and P$_2$O$_5$ Additions

| | Example No. | | | | | |
|---|---|---|---|---|---|---|
| | 37 | 41 | 42 | 43 | 44 | 45 |
| Composition | (Mole %) | | | | | |
| BaO | 11.8 | 11.6 | 11.5 | 11.6 | 11.5 | 11.5 |
| CaO | 10.1 | 10.0 | 9.9 | 10.0 | 9.9 | 9.9 |
| ZnO | 21.3 | 21.0 | 20.7 | 21.1 | 20.8 | 20.7 |
| Al$_2$O$_3$ | 6.9 | 6.8 | 6.7 | 6.8 | 6.7 | 6.7 |
| SiO$_2$ | 47.5 | 46.8 | 46.2 | 46.9 | 46.4 | 46.3 |
| ZrO$_2$ | 2.4 | 3.7 | 5.0 | 2.4 | 2.4 | 3.8 |
| P$_2$O$_5$ | — | — | — | 1.1 | 2.3 | 1.1 |
| TiO$_2$ | — | — | — | — | — | — |
| Glass Properties | | | | | | |
| TCE ($10^{-7}$/°C.) | 78.5 | 79.4 | 72.5* | 76.7* | 80.2* | 79.9* |
| DTA | | | | | | |
| Densification Temp (°C.) | | | | | | |
| Onset | 811 | 825 | 816 | 802 | 807 | 819 |
| Completion | 848 | 862 | 858 | 855 | 848 | 859 |
| Crystallization Temp (°C.) | | | | | | |
| Celsian/Hexacelsian | | | | | | |
| Onset | 860 | 874 | 869 | 874 | 873 | 881 |
| Peak | 890 | 907 | 905 | 919 | 916 | 917 |
| Hardystonite Peak | 906 | 927 | 931 | 935 | — | 946 |
| Dens. Comp-Dens. Onset | 37 | 37 | 42 | 53 | 41 | 40 |
| Cryst. Onset. Dens. Comp. | 12 | 12 | 11 | 19 | 25 | 22 |
| TMA (1 gm weight) | | | | | | |
| Densification | | | | | | |
| Onset | 776 | 788 | 788 | 784 | — | 780 |
| Completion | 839 | 839 | 844 | 828 | — | 837 |
| Shrinkage (%) | 18.1 | 18.5 | 19.1 | 20.3 | — | 22.3 |
| Dens. Comp.-Onset | 63 | 51 | 56 | 44 | — | 57 |
| Dielectric Properties | | | | | | |
| Thickness ($\mu m$) | 31 | 33 | 29 | — | — | — |
| Dielectric Constant | 6.9 | 8.8 | 8.0 | — | — | — |
| Dissipation Factor (%) | 0.10 | 0.21 | 0.17 | — | — | — |
| Insulation Resistance ($10^{12}\Omega$) | 28 | 23 | 22 | — | — | — |
| Breakdown Voltage (KV/mil) | 2.6 | 2.0 | 1.8 | — | — | — |
| Leakage Current ($\mu A/cm^2$) | 0.001 | 0.002 | 0.032 | — | — | — |

*Softening occurred before 850° C., thus the TCE listed was taken at the softening point.

The above data show that the addition ZrO$_2$ causes the densification and crystallization to shift to slightly higher temperatures, which decreases the amount of crystallization that occurs during an 850° C. firing for 10 minutes. With less crystallization, the dissipation factor increased and breakdown voltage decreased. However, low leakage currents were maintained.

Examples 43-45 show that the addition of $P_2O_5$ to the glass of Example 37 did not change the densification temperature range very much. However, the crystallization temperature was raised thus widening the gap between densification and crystallization temperatures. This wider separation between these two properties will insure complete densification.

EXAMPLES 46 AND 47

Two glass compositions were prepared in the manner of Example 37 except that the ratio of $Al_2O_3$ to $ZrO_2$ was decreased and in Example 47 a small amount of $P_2O_5$ was added as well. The composition and properties of these glasses are given in Table 14 below:

TABLE 14

Effect of $Al_2O_3/ZrO_2$ Ratio

| | Example No. | | |
|---|---|---|---|
| | 37 | 46 | 47 |
| Composition | (Mole %) | | |
| BaO | 11.8 | 11.8 | 11.7 |
| CaO | 10.1 | 10.2 | 10.1 |
| ZnO | 21.3 | 21.4 | 21.1 |
| $Al_2O_3$ | 6.9 | 4.6 | 4.5 |
| $SiO_2$ | 47.5 | 47.6 | 47.1 |
| $ZrO_2$ | 2.4 | 4.4 | 4.3 |
| $P_2O_5$ | — | — | 1.1 |
| $Al_2O_3/ZrO_2$ ratio | 2.9 | 1.0 | 1.0 |
| Glass Properties | | | |
| TCE ($10^{-7}/°C$) | 78.5 | 76.4* | 74.5* |
| DTA | | | |
| Densification Temp (°C) | | | |
| Onset | 811 | 811 | 811 |
| Completion | 848 | 851 | 849 |
| Crystallization Temp (°C) | | | |
| Celsian/Hexacelsian | | | |
| Onset | 860 | 923 | 934 |
| Peak | 890 | 960 | 975 |
| Hardystonite Peak | 906 | 981 | — |
| Dens. Comp-Dens. Onset | 37 | 40 | 38 |
| Cryst. Onset. Dens. Comp. | 12 | 72 | 85 |
| TMA (1 gm weight) | | | |
| Densification | | | |
| Onset | 776 | 771 | 774 |
| Completion | 839 | 827 | 833 |
| Shrinkage (%) | 18.1 | 17.5 | 16.5 |
| Dens. Comp.-Onset | 63 | 56 | 59 |

*Softening occurred before 850° C., thus the TCE listed was taken at the softening point.

The foregoing data show that decreasing the $Al_2O_3/ZrO_2$ ratio had no significant effect on the densification range, but had a very large effect in increasing the crystallization temperature. This increased the gap between the densification and crystallization temperatures from 12° to 72° C. These data thus demonstrate the importance of controlling the $Al_2O_3/P_2O_5$ ratio in insuring complete densification of the glass.

The data for Example 47 illustrate that $P_2O_5$ raised the crystallization temperature still further and therefore widened the gap between densification and crystallization.

EXAMPLES 48-50

A series of three compositions in accordance with the invention was formulated having compositional modifications directed to reducing the viscosity of the glass and thus increasing the flow of the glass during firing. The composition and properties of these glasses are given in Table 15 below:

TABLE 15

Compositions with Increased Glass Flow

| | Example No. | | | |
|---|---|---|---|---|
| | 38 | 48 | 49 | 50 |
| Composition | (Mole %) | | | |
| BaO | 9.2 | 9.8 | 6.5 | 7.0 |
| CaO | 19.2 | 14.1 | 16.1 | 16.8 |
| ZnO | 18.5 | 22.8 | 24.1 | 26.9 |
| $Al_2O_3$ | 6.5 | 6.7 | 6.5 | 3.2 |
| $SiO_2$ | 45.2 | 45.1 | 44.6 | 44.3 |
| $ZrO_2$ | 1.3 | 1.5 | 2.3 | 1.9 |
| ZnO/CaO Ratio | 0.96 | 1.62 | 1.50 | 1.60 |
| Glass Properties | | | | |
| TCE ($10^{-7}/°C$) | 84.2 | 71.0 | 68.7 | 76.7 |
| DTA | | | | |
| Densification Temp (°C) | | | | |
| Onset | 823 | 797 | 794 | 784 |
| Completion | 843 | 823 | 831 | 810 |
| Crystallization Temp (°C) | | | | |
| Onset | 870 | 857 | 867 | 837 |
| Peak | 905 | 905 | 910 | 870 |
| Dens. Comp-Dens. Onset | 20 | 26 | 37 | 26 |
| Cryst. Conset. Dens. Comp. | 27 | 34 | 36 | 27 |
| TMA (1 gm weight) | | | | |
| Densification | | | | |
| Onset | 773 | 760 | 760 | 743 |
| Completion | 829 | 816 | 809 | 783 |
| Shrinkage (%) | | | | |
| After Dens. Comp. | 17.2 | 17.1 | 16.7 | 16.4 |
| At Onset of Cryst. | 17.4 | 19.3 | 18.7 | 19.9 |
| Dens. Comp.-Onset | 63 | 59 | 49 | 40 |
| Shrinkage Diff. (%) | 0.2 | 2.2 | 2.0 | 3.5 |

In Example 48, the ZnO/CaO ratio was increased which resulted in a decrease in the thermal expansion and viscosity of the glass. The lower viscosity of the glass, of course, lowers the densification and crystallization temperatures and thus increases the glass flow or softening between densification and crystallization. The glass flow is measured by the difference in TMA shrinkage at complete densification to the shrinkage at the onset of crystallization. The glass flow shrinkage increased from 0.2 to 2.2% upon increasing the ZnO/CaO ratio from 0.96 in Example 38 to 1.62 in Example 48. The higher level of glass flow is desireable in that helps to insure complete densification of the dielectric and thus to produce a smooth fired surface.

The glasses of Examples 49 and 50 also exhibited higher glass flow when compared to the glass of Example 38. The compositional changes from Example 38 to Examples 49 and 50 had little effect on the glass properties. However, by increasing the BaO, CaO and ZnO and by decreasing the $Al_2O_3$, $SiO_2$ and $ZrO_2$ from Example 49, the densification and crystallization temperatures were both lowered.

EXAMPLE 51

An additional glass in accordance with the invention was formulated in the manner of Example 20, except that a portion of the ZnO was replaced with $TiO_2$. As can be seen from the data given in Table 16 below, the substitution of $TiO_2$ resulted in an increase in crystallization temperature with a larger separation between the temperatures of densification and crystallization. Upon firing at 850° C., the modified glass showed viscous flow after densification. These data do indicate that compositions in which ZnO is partially replaced with $TiO_2$ are suitable for 900° C. fireable dielectrics.

TABLE 16

Effect of TiO$_2$ Addition

| | Example No. | |
|---|---|---|
| | 20 | 51 |
| Composition | (Mole %) | |
| BaO | 14.6 | 14.6 |
| ZnO | 24.4 | 16.1 |
| Al$_2$O$_3$ | 7.3 | 7.3 |
| SiO$_2$ | 50.0 | 49.9 |
| ZrO$_2$ | 3.6 | 3.6 |
| TiO$_2$ | — | 8.43 |
| CaO | — | — |
| Glass Properties | | |
| TCE (10$^{-7}$/°C.) | 69.5 | — |
| DTA | | |
| Densification Temp (°C.) | | |
| Onset | 820 | 834 |
| Completion | 872 | 888 |
| Crystallization Temp (°C.) | | |
| Celsian/Hexacelsian | | |
| Onset | 874 | 900 |
| Peak | 905 | 941 |
| Dens. Comp-Dens. Onset | 52 | 54 |
| Cryst. Onset. Dens. Comp. | 2 | 12 |
| TMA (5 gm load) | | |
| Densification | | |
| Onset | 765 | 787 |
| Completion | 842 | 850 |
| Shrinkage (%) | 20.4 | 20.4 |
| Dens. Comp.-Onset | 77 | 63 |

EXAMPLE 52

Effect of Impurities

To investigate the effect of common impurities on the properties of the glasses described here, glasses with composition of Example 37 were prepared with the following mole percentages of impurities added individually to Example 37: Na$_2$O—0.38, B$_2$O$_3$—0.34, Fe$_2$O$_3$—0.15, PbO—0.11 and 0.72. Glasses prepared with impurities at these levels did not show any change in densification or crystallization behaviour. These data show that up to as much as 0.5mole % of commonly occurring impurities such as alkali metal ions, alkaline earth ions, B, Fe, Pb, etc will not cause a significant change in densification, crystallization and electrical properties of the glasses of the invention.

EXAMPLES 53-58

To observe the effect of blending the glasses of the invention, a series of three high-expansion (high TCE) glasses was prepared. Each of the glasses was blended 50/50 by weight with the glass of Example 29 and the dielectric properties of the high TCE glasses and the blends were measured. The TCE and dielectric properties of each of these glasses are given in Table 17 below:

TABLE 17

Blending of High and Low TCE Glasses

| | Example No. | | | | | | |
|---|---|---|---|---|---|---|---|
| | 53 | 54 | 55 | 56[1] | 57[2] | 58[3] | 29 |
| Glass Composition | (Mole %) | | | | | | |
| BaO | 12.6 | 16.8 | 11.8 | — | — | — | 11.8 |
| SrO | 10.8 | 10.1 | 10.2 | — | — | — | 10.1 |
| CaO | 6.7 | — | 5.0 | — | — | — | — |
| ZnO | 16.0 | 16.3 | 16.4 | — | — | — | 21.3 |
| Al$_2$O$_3$ | 5.5 | 6.9 | 6.0 | — | — | — | 6.9 |
| SiO$_2$ | 46.0 | 47.5 | 48.2 | — | — | — | 47.5 |
| ZrO$_2$ | 2.4 | 2.4 | 2.4 | — | — | — | 2.4 |

TABLE 17-continued

Blending of High and Low TCE Glasses

| | Example No. | | | | | | |
|---|---|---|---|---|---|---|---|
| | 53 | 54 | 55 | 56[1] | 57[2] | 58[3] | 29 |
| TCE, calculated[4] | 8.3 | 7.9 | 7.7 | — | — | — | 6.8 |
| Dielectric Properties | | | | | | | |
| K | 10.2 | 10.3 | 9.6 | 9.1 | 9.6 | 8.9 | 8.9 |
| DF | 0.17 | 0.14 | 0.10 | 0.09 | 0.10 | 0.10 | 0.10 |
| Leakage Current (MA/cm$^2$) | 10 | 186 | 36 | 0.03 | 0.40 | 0.32 | 0.003 |

[1] 50/50 by weight blend of Examples 53 and 29 glasses
[2] 50/50 by weight blend of Examples 54 and 29 glasses
[3] 50/50 by weight blend of Examples 55 and 29 glasses
[4] Hormadaly, J., "Empirical Methods for Estimating the Linear Coefficient of Expansion of Oxide Glasses From Their Composition", Jnl. of Non-Crystalline Solids, vol. 79, 311–324 (1986)

The foregoing data show that the blending of the high TCE glasses with low TCE glasses resulted in glass blends having somewhat lower K and DF values, but quite surprisingly lower leakage currents.

EXAMPLES 59-63

Each of the glasses of Examples 29, 53 and 56-58 was prepared as a thick film paste. Four layers of each paste were screen printed on a 2"×2" alumina substrate and sequentially fired to simulate circuit fabrication conditions. The amount of bowing per layer of each substrate was then measured after the first and last firing step. Positive (upward) bowing indicates that the fired thick films had a lower TCE than the substrate. No bowing indicates that the fired thick films had substantially the same TCE as the substrate and negative (downward) bowing indicates that the fired thick film had a higher TCE than the substrate. An acceptable dielectric is one which bows less than 0.35 mil/inch/layer. The bowing data for these materials, which are given in Table 18 below, show that the blending of such glasses can be used effectively to obtain expansion matching with the alumina substrate.

TABLE 18

Glass Blending to Match Substrate TCE

| | Example No. | | | | |
|---|---|---|---|---|---|
| | 59 | 60 | 61 | 62 | 63 |
| Glass Example No. | 29 | 56 | 57 | 58 | 53 |
| Component Glass(es) | | | | | |
| Ex. No. | 29 | 29/53 | 29/54 | 29/55 | 53 |
| % wt. | 100 | 50/50 | 50/50 | 50/50 | 100 |
| Bowing (mils/in/layer) | | | | | |
| After 1 Firing | 0.18 | 0.03 | 0.03 | −0.04 | −0.25 |
| After 4 Firings | 1.6 | 0.16 | −0.13 | 0.09 | −0.13 |

EXAMPLES 64-68

Glasses that flow well on firing are needed to obtain satisfactorily low leakage currents. However, when the glasses are used with copper conductors they are fired in a non-oxidizing atmosphere such as nitrogen and they tend to form a seal on the surface of the glass before burnout of the organics from the organic medium is complete and then to form blisters as burnout proceeds. On the other hand, glasses that crystallize tend to hold the structure open and thus eliminate blister formation. However, too much crystallization results in a porous glass which has a high leakage current. The following experiments were carried to observe this phenomenon and to show how the glasses of the invention can be blended to eliminate blistering during firing:

A highly crystallizing glass (Glass A) was prepared in the manner described above having the composition, by mole %, BaO—15.7%, CaO—4.5%, ZnO—18.7%, SiO$_2$—46.1%, Al$_2$O$_3$—12.2% and ZrO$_2$—2.8%. Thick film pastes were prepared from this glass and from the less crystallizing glass of Example 53 and three blends of the pastes were prepared in the proportions by weight of 40/60, 30/70 and 20/80 Glass 53/Glass A. Each of the five pastes was printed over previously fired copper electrodes and fired in a nitrogen belt furnace at 900° C. peak temperature.

The data in Table 19 show that the blends of crystallizing and non-crystallizing glasses resulted in fired layers which were quite dense and had low leakage current. Furthermore, dielectric properties were not adversely affected to any significant extent by the blending.

TABLE 19

| Glass Blending to Improve Densification | | | | | |
|---|---|---|---|---|---|
| | Example No. | | | | |
| | 64 | 65 | 66 | 67 | 68 |
| Component Glasses | | | | | |
| Ex. No. | 53 | 53/A | 53/A | 53/A | A |
| % wt. | 100 | 40/60 | 30/70 | 20/80 | 100 |
| Film Character | Pinholes, Blisters | Dense | Dense | Dense | Porous |
| Film Properties | | | | | |
| Leakage Current (MA/cm$^2$) | 700 | 0.4 | 0.4 | 4.0 | 1100 |
| Dielectric Properties | | | | | |
| K | — | 9.4 | 8.9 | — | — |
| DF, % | — | 0.4 | 0.3 | — | — |

We claim:

1. A dielectric glass composition consisting essentially on a molar basis of 15-27% ZnO, 8-30% alkaline earth metal oxides selected from 7-21% BaO, 0-20% CaO, 0-12% SrO and mixtures thereof, 40-60% SiO$_2$, 3-14% Al$_2$O$_3$, 0-5% PbO and 0.5-5% of an oxide selected from ZrO$_2$, 0.5 to 2.5% P$_2$O$_5$ and mixtures thereof, the composition being crystallizable and non-reducing when fired at 850°-900° C.

2. A thick film encapsulant composition comprising finely divided particles of the glass composition of claim 1 dispersed in a liquid organic medium.

3. A dielectric film on a substrate formed by (1) applying a layer of the composition of claim 2 to the substrate and (2) heating the layer for 30-60 minutes of which 5-10 minutes is at a peak temperature of 850°-900° C. to effect (a) volatilization of the organic medium and (b) formation of crystals from the dielectric glass which are dispersed in the remainder glass.

* * * * *